United States Patent
Börner et al.

(10) Patent No.: US 6,234,645 B1
(45) Date of Patent: May 22, 2001

(54) LED LIGHTING SYSTEM FOR PRODUCING WHITE LIGHT

(75) Inventors: Herbert Friedrich Börner, Aachen; Wolfgang Busselt, Roetgen; Thomas Jüstel, Aachen; Hans Nikol, Aachen; Cornelis R. Ronda, Aachen, all of (DE)

(73) Assignee: U.S. Philips Cororation, New York, NY (US)

( * ) Notice: Subject to any disclaimer, the term of this patent is extended or adjusted under 35 U.S.C. 154(b) by 0 days.

(21) Appl. No.: 09/396,561

(22) Filed: Sep. 15, 1999

(30) Foreign Application Priority Data

Sep. 28, 1998 (EP) .................................................. 98203248

(51) Int. Cl.⁷ ........................................................ F21V 9/00
(52) U.S. Cl. .......................... 362/231; 362/545; 362/555; 362/800
(58) Field of Search ..................................... 362/555, 545, 362/231, 235, 324, 800, 227, 230

(56) References Cited

U.S. PATENT DOCUMENTS

| 5,001,609 | * 3/1991 | Gardner et al. | 362/32 |
| 5,515,136 | 5/1996 | Nishio et al. | 355/37 |
| 5,803,579 | * 10/1998 | Turnbull et al. | 362/83.1 |
| 5,851,063 | 12/1998 | Doughty et al. | 362/231 |

FOREIGN PATENT DOCUMENTS

| 3916875 | 12/1990 | (DE) | B60Q/1/26 |

* cited by examiner

*Primary Examiner*—Sandra O'Shea
*Assistant Examiner*—Guiyoung Lee
(74) *Attorney, Agent, or Firm*—Dicran Halajian

(57) ABSTRACT

As a white light source, the lighting system (1) has at least three light-emitting diodes (6, 7, 8) for providing visible light at preselected wavelengths. The invention is characterized in that the lighting system (1) is provided with at least one fourth light-emitting diode (9) which, in operation, emits visible light in a further wavelength region, the maximum of the spectral emission of the fourth light-emitting diode (9) lying in the further wavelength region from 575 to 605 nm. Preferably, the further wavelength region ranges from 585 to 600 nm. Preferably, the color rendition of the lighting system (1) is above 60. Preferably, the luminous efficacy of the lighting system (1) is above 30 lm/W, preferably above 40 lm/W. In another preferred embodiment, the color temperature of the lighting system (1) can be adjusted by selectively switching the light-emitting diodes (6, 7, 8, 9).

8 Claims, 2 Drawing Sheets

LED LIGHTING SYSTEM FOR PRODUCING WHITE LIGHT

BACKGROUND OF THE INVENTION

The invention relates to a lighting system for producing white light, which lighting system comprises at least three light-emitting diodes, each one of the light-emitting diodes emitting, in operation, visible light in a preselected wavelength range.

Lighting systems on the basis of light-emitting diodes (LEDs) are used as a source of white light for general lighting applications.

U.S. Pat. No. 5,851,063 discloses a lighting system which employs three LEDs as a light source for; making white light. In this lighting system it is calculated that the maxima of the emission spectra of the LEDs are preferably selected in the wavelength ranges from 455 to 490 mn, 530 to 570 nm and 605 to 630 nm. For such a lighting system it is further calculated that a color rendering index in excess of 80 can be achieved.

Such lighting systems have the drawback that LEDs with spectral maxima in these spectral ranges and, simultaneously, a sufficient energy efficiency are not available. In a lighting system in which such LEDs are employed, particularly the luminous efficacy is adversely influenced.

SUMMARY OF THE INVENTION

It is an object of the invention to provide a lighting system which can be used in practice. The invention further aims at providing a lighting system having a relatively high luminous efficacy.

To achieve this, the lighting system includes at least a fourth light-emitting diode which, in operation, emits visible light in a further wavelength range, the maximum of the spectral emission of the fourth light-emitting diode lying in the further wavelength range from 575 to 605 nm.

By employing four types of LEDs having different spectral ranges, the possibilities of combining LEDs are extended. In order to obtain a lighting system producing white light with a good color rendition, which is based on the three primary colors blue, green and red, it is desirable that the emission maxima of the spectral ranges of the LEDs lie in the ranges from 430 to 490 nm (blue), 530 to 565 nm (green) and 590 to 630 nm (red). In these wavelength ranges, blue and red LEDs with a reasonable luminous efficacy are commercially available, however, green LEDs with the desirable spectral range and comparable luminous efficacy are not or hardly available. Available "green" LEDs having an efficiency which is approximately half that of their blue equivalents emit in the blue-green spectral range between 500 and 525 nm, which does not include the desired spectral range. In addition, as the load at the input of the LED increases, a (further, undesirable) shift towards the blue is observed. Since LEDs with a spectral range in the yellow region (maximum of the spectral emission in the wavelength range from 565 to 605 nm) and a high luminous efficacy are available, a practically usable lighting system producing white light with the desired color rendition is obtained by combining (commercially available) blue, "green" (emission in the blue-green range), yellow and red LEDs. By using commercially available LEDs, a lighting system is obtained which also exhibits a relatively high luminous efficacy.

Highly efficient yellow LEDs on the basis of GaAs have been available for some years and are also increasingly used for signaling purposes, such as rear lights (of vehicles), traffic lights and traffic-signaling systems.

U.S. Pat. No. 5,851,063 also discloses four different types of LEDs as the light source for producing white light, and it is calculated that the maxima of the emission spectra of the LEDs are selected in the wavelength ranges from 440 to 450 nm, 455 to 505 nm, 555 to 565 nm and 610 to 620 nm. These wavelength ranges are based on calculations of the desired light quality on the basis of LEDs with a desired emission spectrum. The known lighting system is apparently not based on commercially available LEDs. The lighting system in accordance with the invention comprises a practically feasible combination of (the spectral characteristics of) known and commercially available LEDs for manufacturing a light source producing white light with a relatively high luminous efficacy.

It is desirable to determine a relatively limited wavelength range within which the maximum of the spectral emission of the fourth light-emitting diode is situated. Preferably, the maximum of the spectral emission of the fourth light-emitting diode lies in the wavelength range from 585 to 600 nm. The use of such yellow LEDs causes the harmony with the other three types of LEDs to be improved. Since the photopic sensitivity of the human eye in the wavelength range is maximal at 555 nm, relatively small variations in the spectral range of the yellow LED have a relatively large effect on the color rendition of the lighting system. A (commercially available) yellow LED having a maximum spectral emission at 595 nm (20 nm FWHM, energy-efficiency 20%) is very suitable.

Preferably, the color rendering index (Ra) of the lighting system is at least equal to or greater than $60 (R_a \geq 60)$. By a suitable combination of the spectral emissions of the four light sources, a lighting system is obtained having a relatively high luminous efficacy and a good color rendering index.

Preferably, the luminous efficacy of the lighting system is at least equal to or greater than 30 lm/W. Lighting systems on the basis of LEDs having such an efficiency are commercially attractive. In a particularly preferred embodiment, the luminous efficacy of the lighting system is greater than 40 lm/W. For comparison, a typical 100 W incandescent lamp has a luminous efficacy of 14 lm/W (color temperature 2800 K, color rendering index 100), a 500 W halogen incandescent lamp has a luminous efficacy of approximately 19 lm/W (color temperature 3000 K, color rendering index 100), while a 36 W fluorescent lamp has a luminous efficacy of approximately 89 lm/W (color temperature 4000 K, color rendering index 85). The color rendering index of the lighting system in accordance with the invention is lower than that calculated in the known lighting system, however, the luminous efficacy of the lighting system in accordance with the invention is substantially higher and the lighting system in accordance with the invention is based on a combination of commercially available light-emitting diodes.

Preferably the three light-emitting diodes comprise a blue light-emitting diode, a blue-green light-emitting diode and a red light-emitting diode, and the fourth light-emitting diode includes a yellow light-emitting diode. In this manner, a lighting system is obtained which emits white light with a good color rendition on the basis of four basic colors (blue, blue-green, yellow and red). Preferably, the maximum of the spectral emission of the blue light-emitting diode lies in the wavelength range from 460 to 490 nm, the maximum of the spectral emission of the blue-green light-emitting diode lies in the wavelength range from 510 to 530 nm, and the maximum of the spectral emission of the red light-emitting diode lies in the wavelength range from 610 to 630 nm. LEDs having such spectral ranges and a relatively high energy efficiency are commercially feasible. By using the yellow-type LEDs, the "mismatch" in the color of the green LED, which emits blue-green light, is compensated.

A point of special interest in the lighting system in accordance with the invention is that, in general, LEDs emit light with a high directivity, while it is desirable for the LEDs to emit (diffuse) light in accordance with a Lambertian radiator.

The invention further aims at improving the blending of light of the lighting system. To achieve this, an alternative embodiment of the lighting system in accordance with the invention is characterized in that the lighting system is further provided with reflection means. The LEDs are provided in the lighting system in such a manner that a substantial part of the light originating from the LEDs cannot directly leave the lighting system, but instead is incident on the reflection means. An advantage of the use of reflection means is that light originating from the (blue and red) LEDs and the (green) light originating from the conversion means is blended. The reflection means are preferably diffusely reflecting reflection means. By directing the light originating from the LEDs to the diffusely reflecting reflection means, the reflected light also acquires the character of a Lambertian radiator. As a result, the blending of the various color components and hence the color rendition of the lighting system are further improved. Furthermore, the reflection means preferably reflect the light without causing a change of the color rendition (white-reflecting reflection means). As a result, undesirable color deviations in the light emitted by the lighting system are precluded.

Preferably, the reflection means comprise a material selected from the group formed by $BaSO_4$, ZnS, ZnO and $TiO_2$. Such materials are very suitable because their reflection coefficient in the wavelength range from 400 to 800 nm is above 98%, and, in addition, they reflect the light in a diffuse and wavelength-independent manner.

It is further desirable for the color temperature of the lighting system to be variable. An alternative embodiment of the lighting system in accordance with the invention is characterized in that the color temperature of the lighting system is adjustable by separately driving the light-emitting diodes. The color temperature is (electrically) adjustable by separately driving various colors. By suitably switching on and off (diode chains of) LEDs, an adjustable color temperature range from 2000 to 6300 K is obtained.

BRIEF DESCRIPTION OF THE DRAWINGS

The Figures are purely schematic and not drawn to scale. Particularly for clarity, some dimensions are exaggerated strongly. In the Figures, like reference numerals refer to like parts whenever possible.

DETAILED DESCRIPTION OF THE PREFERRED EMBODIMENTS

Figure 1:
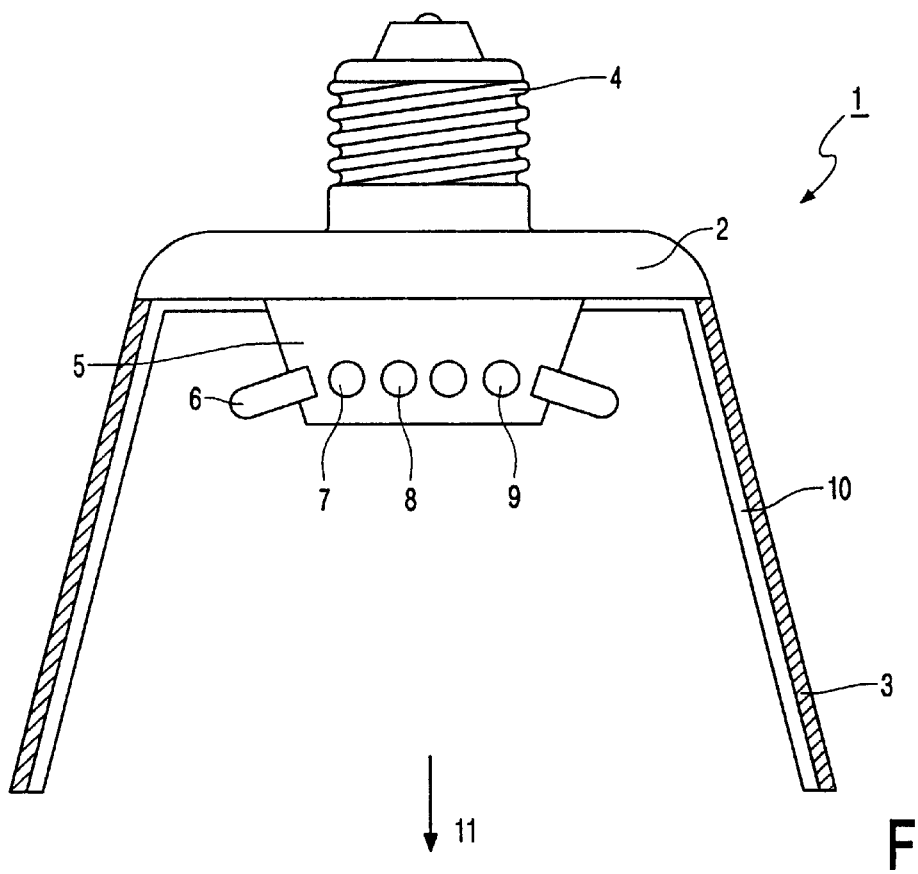
FIG. 1 shows, partly in cross-section and in side elevation, an embodiment of the lighting system in accordance with the invention.

FIG. 1 shows, a housing 2 accommodating drive electronics (not shown in FIG. 1) for the light-emitting diodes (LEDs) and a screen 3. In this example, the housing is provided with a so-called E27 lamp cap 4 having mechanical and electrical contact means which are known per se. On a side of the lighting system 1 facing away from the lamp cap 4, there is holder 5 on which a number of LEDs 6, 7, 8, 9 are provided. The LEDs 6, 7, 8 comprise a collection of blue LEDs 6 (maximum of the spectral emission lies in the wavelength range from 460 to 490 nm), so-called blue-green LEDs 7 (maximum of the spectral emission lies in the wavelength range from 510 to 530 nm), and red LEDs 8 (maximum of the spectral emission lies in the wavelength range from 590 to 630 nm). In accordance with the invention, the LEDs 9 comprise light-emitting diodes which emit yellow light (maximum of the spectral emission lies in the wavelength range from 575 to 605 nm). The LEDs 6, 7, 8, 9 are arranged so that the light that they emit is directed towards the screen 3. Said screen 3 is provided on a side facing the LEDs 6, 7, 8, 9 with reflection means 10 which diffusely reflect white light. The diffusely reflecting reflection means 10 include, in this example, a layer of $BaSO_4$, which material has a (diffuse) reflection coefficient for visible light of substantially 100%. The reflection means 10 effectively blend the light of the LEDs 6, 7, 8, 9, said LEDs being positioned relative to the screen 3 in such a manner that said LEDs do not directly emit their light in a direction 11 of the light emitted by the lighting system 1; instead their light output is directed to an inner side of the screen 3 in such a manner that only reflected light is emitted in the direction 11.

In order to vary the color temperature of the lighting system 1 and be able to adjust the color temperature in accordance with the requirements, the LEDs can be separately driven, thus causing the proportions of the different colors of light originating from the LEDs to vary.

By way of example, Table I shows a lighting system comprising:

blue LEDs (make Nichia): emission maximum: 470 nm, half width value (FWHM): 20 nm and lumen equivalent: 68 lm/W;

blue-green LEDs (make Nichia): emission maximum: 520 nm, FWHM: 40 nm;

yellow LEDs (make Hewlett Packard): emission maximum: 590 nm, FWHM: 20 nm and lumen equivalent (blue-green+yellow): 483 lm/W;

red LEDs (make Hewlett Packard): emission maximum: 620 nm, FWHM: 20 nm and lumen equivalent of 263 lm/W.

Column 1 in Table 1 lists various desired values of the color temperature ($T_c$). Columns 2, 3 and 4 in Table I list the spectral contributions (x) of the three light components (sum of the three spectral contributions x amounts to 1). The spectral contributions of the blue-green and the yellow LEDs are added together in column 3 of Table I. Column 5 of Table I lists the color rendering index ($R_a$), and column 6 the luminous efficacy (lum. eff.) of the lighting system. Table I shows that the color temperature of the lighting system can be readily adjusted within a very wide range by only changing the distribution of the light sources (particularly of the blue and red LEDs).

Table I Combination of blue and green/yellow and red LEDs in an embodiment of the lighting system in accordance with the invention.

| $T_c$ [K] | x [blue] | x [green/yellow] | x [red] | $R_a$ | lum.eff. [lm/W] |
|---|---|---|---|---|---|
| 2700 | 0.075 | 0.575 | 0.350 | 71 | 46.3 |
| 2900 | 0.116 | 0.577 | 0.307 | 70 | 44.1 |
| 4000 | 0.199 | 0.621 | 0.180 | 66 | 40.5 |
| 5000 | 0.267 | 0.609 | 0.124 | 63 | 37.1 |
| 6300 | 0.321 | 0.614 | 0.065 | 59 | 34.9 |

In accordance with the measure of the invention, a lighting system based on four types of LEDs is obtained in this manner, which lighting system has a relatively high luminous efficacy ($35 \leq$ lum. eff. $\leq 50$ lm/W) and a relatively good color rendition ($60 \leq R_a 70$).

Figure 2:
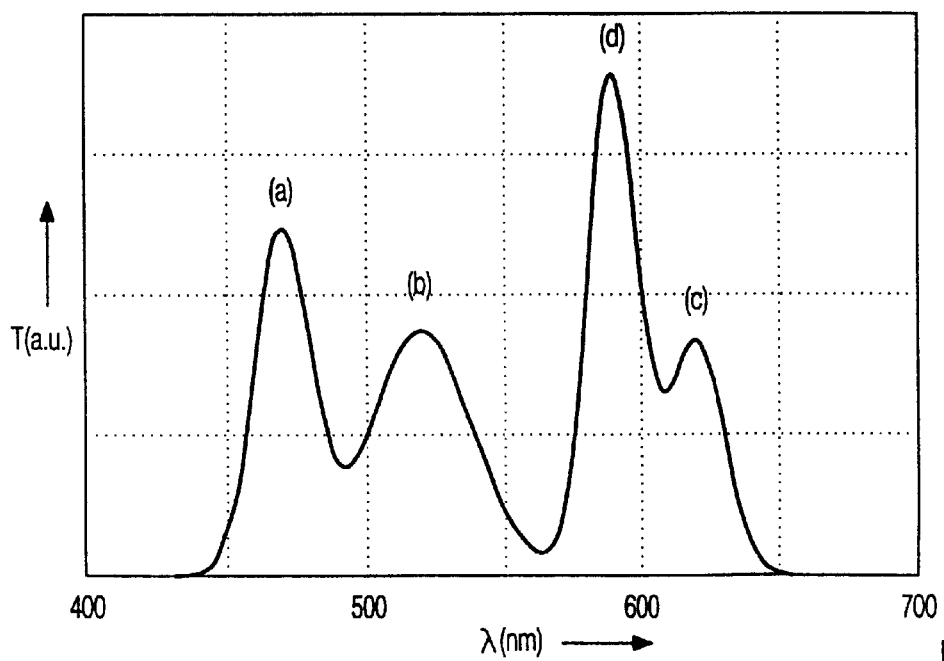
FIG. 2 shows the transmission spectrum of an embodiment of the lighting system in accordance with the invention.

FIG. 2 shows the transmission spectrum of an embodiment of the lighting system in accordance with the invention. The transmission T (arbitrary units) is plotted as a the wavelength λ (nm) of visible light for a combination of blue, blue-green, yellow and red LEDs at a color temperature $T_c$=4000 K (the spectrum in FIG. 2 corresponds to the data in row 4 of Table I). In FIG. 2, the spectral maximum of the blue LEDs 6 is indicated by (a) and corresponds to a wavelength of 470 nm, the spectral maximum of the blue-green LEDs 7 is indicated by (b) and corresponds to a wavelength of 520 nm, and the spectral maximum of the red LEDs 8 is indicated by (c) and corresponds to a wavelength of 620 mn. In accordance with the invention, the lighting system includes a fourth type of LEDs 9 which, in operation, emits visible light in a further wavelength range. In FIG. 2, the spectral maximum of the yellow LEDs 9 is indicated by (d) and corresponds to a wavelength of 590 nm. This means that the emission spectrum of the fourth type of LED 9 lies in the further wavelength range of from 575 to 605 nm.

An improvement of the color rendition of the lighting system is obtained by employing deep-red LEDs with a spectral emission spectrum in the wavelength range from 620 to 670 nm.

Figure 3:
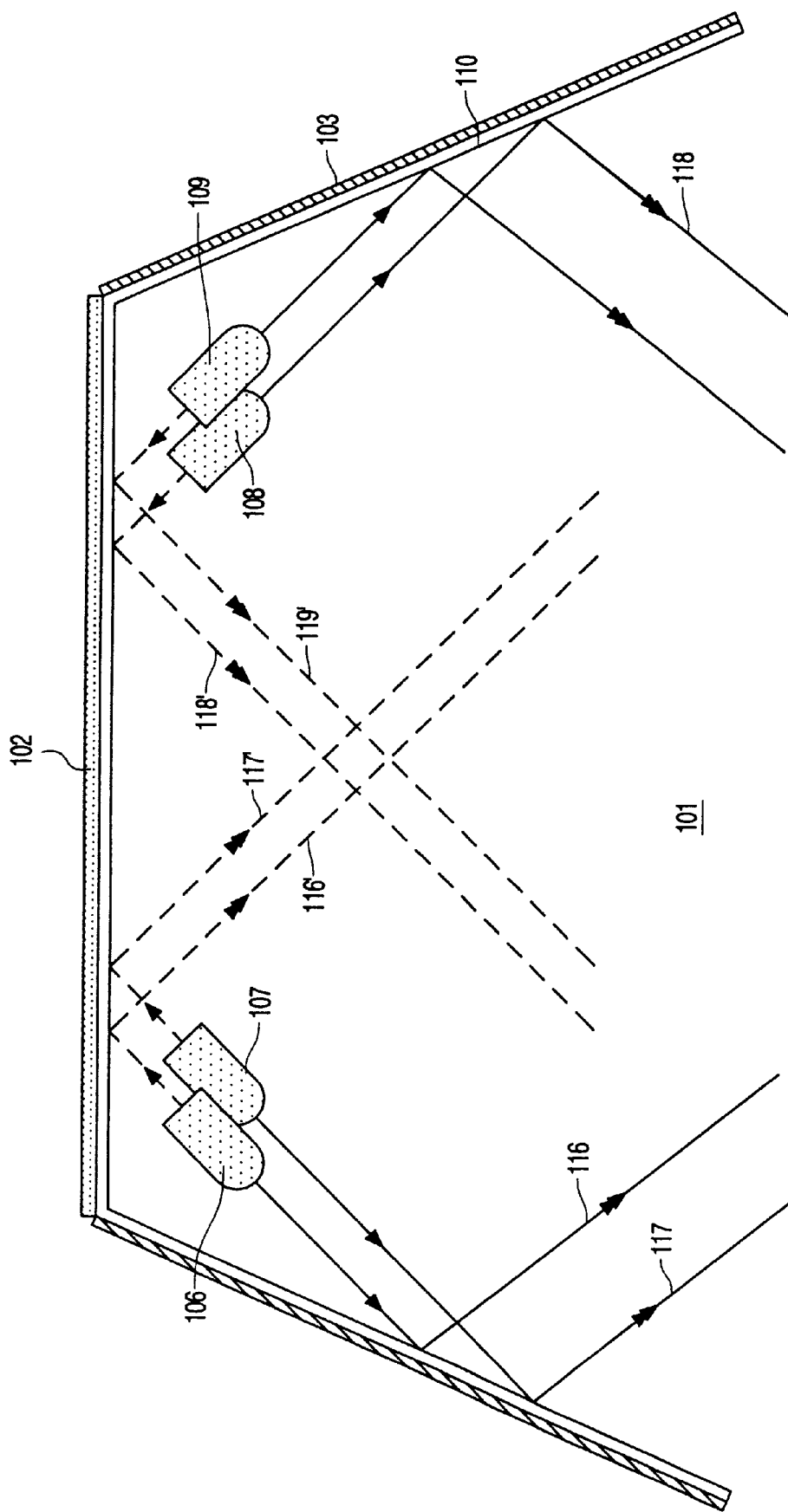
FIG. 3 is a cross-sectional view of an alternative embodiment of the lighting system in accordance with the invention.

FIG. 3 very schematically shows an alternative embodiment of the lighting system in accordance with the invention. The lighting system 101 comprises a housing 102 and a screen 103. In the lighting system 101 there is provided a number of LEDs 106, 107, 108, 109. For clarity, only four LEDs are shown in FIG. 3. The LEDs 106, 107, 108 include a collection of blue LEDs 106 (spectral emission $430 \leq \lambda \leq 490$ nm), blue-green LEDs (spectral emission $510 \leq \lambda \leq 530$ nm) and red LEDs 107 (spectral emission $590 \leq \lambda \leq 630$ nm). In accordance with the invention, the LEDs 109 comprise light-emitting diodes which emit yellow light (spectral emission $575 \leq \lambda \leq 605$ nm). The LEDs 106, 107, 108, 109 are arranged so that the light which they emit is directed at the screen 3 (the direction of the light is schematically indicated by the continuous lines representing light rays in FIG. 3). The sides of the housing 102 and the screen 103 facing the LEDs are provided with reflection means 110 (which diffusely reflect white light). By directing the light originating from the LEDs at the diffusely reflecting reflection means 110, effective blending of the various colors is brought about, and, in addition, the reflected light acquires the character of a Lambertian radiator. The path of the light rays emitted by the LEDs 106, 107, 108, 109 and of the reflected light is diagrammatically indicated by continuous lines in FIG. 3. Since the housing too is provided with the reflection means 110, also the light emitted backwards by the LEDs is reflected and, thus, contributes to the luminous efficacy of the lighting system. Such a lighting system is provided, for example, with 40 to 100 diodes, in a ratio of 2 blue LEDs : 4 blue-green LEDs: 2 yellow LEDs: 1 red LED, the relative contributions of LEDs being set in accordance with the values listed in Table I so as to obtain a desired color temperature. The diodes are preferably arranged in two double rows, which include an angle smaller than 90° with the housing 102 (schematically shown in FIG. 3). Light emitted in the forward direction by the LEDs 106, 107, 108, 109 (indicated in FIG. 3 by the arrows 116, 117, 118, 119 ) can only leave the lighting system via at least one reflection against the screen 103 provided with the reflection means 110, for example a white pigment such as $BaSO_4$. By virtue of the oblique arrangement of the LEDs, also the light emitted in the backward direction by the LEDs 106, 107, 108, 109 can leave the lighting system 101 via multiple reflection (indicated in FIG. 3 by the arrows 116', 117', 118', 119'), thereby effectively contributing to the luminous efficacy of the lighting system 101.

The lighting system in accordance with the invention has the advantage that a relatively high luminous efficacy ($\geq 30$ lm/W) is obtained in combination with a good color rendition ($60 \leq R_a \leq 75$) of the system and a long service life ($\leq 75,000$ hours).

It will be obvious that within the scope of the invention many variations are possible to those skilled in the art.

The invention is embodied in each novel characteristic and each combination of characteristics.

What is claimed is:

1. A lighting system for producing white light, which lighting system comprises four light-emitting diodes, each one of the light-emitting diodes emitting, in operation, visible light in a preselected wavelength range, one of the said light emitting diodes having a maximum of spectral emission lying in the wavelength range from 575 to 605 nm, wherein the luminous efficacy of the lighting system is greater than 40 lm/W.

2. A lighting system as claimed in claim 1, wherein the maximum of the spectral emission of said one of the said light emitting diodes lies in the wavelength range from 585 to 600 nm.

3. A lighting system as claimed in claim 1, wherein a color rendering index of the lighting system is at least 60.

4. A lighting system as claimed in claim 1, wherein the four light-emitting diodes comprise a blue light-emitting diode, a blue-green light-emitting diode, a red light-emitting diode, and a yellow light-emitting diode.

5. A lighting system as claimed in claim 4, wherein the maximum of the spectral emission of the blue light-emitting diode lies in the wavelength range from 460 to 490 nm, the maximum of the spectral emission of the blue-green light-emitting diode lies in the wavelength range from 510 to 530 nm, and the maximum of the spectral emission of the red light-emitting diode lies in the wavelength range from 610 to 630 nm.

6. A lighting system as claimed in claim 1, wherein the lighting system provided with reflection means.

7. A lighting system as claimed in claim 6, wherein the reflection means comprise a material selected from the group formed by $BaSO_4$, ZnS, ZnO and $TiO_2$.

8. A lighting system as claimed in claim 1, wherein the color temperature of the lighting system is adjustable by separately driving the light-emitting diodes.

* * * * *